(12) United States Patent
Ma et al.

(10) Patent No.: US 10,907,772 B2
(45) Date of Patent: *Feb. 2, 2021

(54) LED LAMP AND LED EMITTER OF THE SAME

(71) Applicant: Graphene Lighting China Limited, Nanjing (CN)

(72) Inventors: Wenbo Ma, Shenzhen (CN); Qiurong Liao, Shenzhen (CN); Yu Li, Shenzhen (CN); Kuo-Hsin Chang, Chiayi (TW); Chung-Ping Lai, Hsinchu County (TW)

(73) Assignee: GRAPHENE LIGHTING CHINA LIMITED, Nanjing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/569,672

(22) Filed: Sep. 13, 2019

(65) Prior Publication Data

US 2020/0378562 A1    Dec. 3, 2020

Related U.S. Application Data

(63) Continuation-in-part of application No. 16/424,475, filed on May 28, 2019.

(51) Int. Cl.
*F21K 9/232* (2016.01)
*H01L 25/075* (2006.01)
(Continued)

(52) U.S. Cl.
CPC .............. *F21K 9/232* (2016.08); *F21K 9/238* (2016.08); *H01L 25/0753* (2013.01);
(Continued)

(58) Field of Classification Search
CPC . F21K 9/232; F21K 9/235; F21K 9/64; F21K 9/238; H01L 25/0753;
(Continued)

(56) References Cited

U.S. PATENT DOCUMENTS

2013/0215625 A1* 8/2013 Takeuchi .............. F21V 23/001
  362/363
2017/0048941 A1* 2/2017 Kondo .................... F21K 9/238
(Continued)

FOREIGN PATENT DOCUMENTS

CN          204372764      6/2015
TW          M487587        10/2014

*Primary Examiner* — Alan B Cariaso
(74) *Attorney, Agent, or Firm* — Chun-Ming Shih; Lanway IPR Services

(57) ABSTRACT

An LED lamp contains: a base, a casing, a support, multiple LED emitters, a cap, and a driver. The casing includes an accommodation chamber and an opening. The base includes at least one first conductive element. The support includes at least one second conductive element. Each of the at least one LED emitter includes: a first LED chip string having multiple first LED chips connected in series, a second LED chip string having multiple second LED chips connected in series, a substrate, a high-color-temperature phosphor layer, and a low-color-temperature phosphor layer. The driver is electrically connected with the at least one first conductive element and the at least one second conductive element. A total resistance value of the first LED chip string is different from a total resistance value of the second LED chip string.

20 Claims, 3 Drawing Sheets

(51) Int. Cl.
  *H01L 33/62*     (2010.01)
  *F21K 9/238*     (2016.01)
  *H01L 33/50*     (2010.01)
  *H05B 45/46*     (2020.01)
  *H05B 45/10*     (2020.01)
(52) U.S. Cl.
  CPC ............ *H01L 33/504* (2013.01); *H01L 33/62* (2013.01); *H05B 45/46* (2020.01); *H05B 45/10* (2020.01)
(58) Field of Classification Search
  CPC ....... H01L 33/507; H01L 33/62; H05B 45/46; H05B 45/48; H05B 45/40; F21S 4/20; F21S 4/28
  See application file for complete search history.

(56) References Cited

U.S. PATENT DOCUMENTS

| | | | | |
|---|---|---|---|---|
| 2018/0328543 A1* | 11/2018 | Bergmann | .............. | H01L 33/60 |
| 2019/0128512 A1* | 5/2019 | Bai | ..................... | F21V 23/004 |
| 2019/0371768 A1* | 12/2019 | You | ..................... | F21V 23/003 |

* cited by examiner

LED LAMP AND LED EMITTER OF THE SAME

This application is a Continuation-in-Part of application Ser. No. 16/424,475, filed May 28, 2019.

BACKGROUND OF THE INVENTION

Field of the Invention

The present invention relates to a lighting device, especially to an LED lamp having at least one LED emitter.

Description of the Prior Art

Owing to rising demand for energy conservation and carbon reduction and increasing environmental awareness, conventional incandescent lights or mercury lamps are gradually replaced by LED lamps in various countries worldwide.

Among various applications of the LED lamps, LED luminaires with different color temperatures are used in different workplaces. For example, warm color with the color temperature below about 3300K makes people feel warm and comfortable and hence suitable for home, residence, dormitory and other places where the temperature is relatively low. As to white light with the color temperature ranging from 3300K to 5300K, it gives people a pleasant, comfortable and peaceful feeling and suitable for stores, hospitals, offices, restaurants, waiting rooms and other places. The cold light whose color temperature is over 5300K is close to natural light. It has a bright feeling and makes people concentrate. Thus it is suitable for offices, conference rooms, classrooms, library reading rooms exhibition windows and other places.

However, most of light emitted from LED filament lamps available now has a single color temperature. Although the brightness of the lamp can be adjusted, the lamp has limited applications, unable to meet requirements for different sites and consumer's needs owing to the non-adjustable color temperature.

There are some lighting devices having LED filament with two different color temperatures available on the market now. Refer to Chinese Pat. Pub. No. CN204372764U published on Jun. 3, 2015 and Taiwanese Pat. Pub. No. M487587 published on Oct. 1, 2014, the color temperature is adjusted through control of the electric current of two sets of filaments with different color temperatures. Yet the lighting devices have poor color mixing performance owing to differences in the position of the LED filaments and the direction of light projection. Moreover, the circuit board is provided with a plurality of drive elements with larger volume for control of the electric current of the two sets of LED filaments. Thereby not only the cost is increased, the appearance of the LED lamp and internal wiring layout of the circuit board are also affected. These lead to lower market acceptance.

The present invention has arisen to mitigate and/or obviate the afore-described disadvantages.

SUMMARY OF THE INVENTION

The primary objective of the present invention is to provide an LED lamp having at least one LED emitter which is capable of adjusting the color temperature of the lights emitted from the LED lamp gradually through the at least one LED emitter with high and low color temperatures during power adjustment process, thus obtaining a brilliant color mixing.

To obtain above-mentioned objective, an LED lamp provided by the present invention contains: a base, a casing, a support, multiple LED emitters, a cap, and a driver.

The casing includes an accommodation chamber and an opening communicating with the accommodation chamber.

The base is accommodated in the accommodation chamber, an end of the base is connected with the opening so as to close the accommodation chamber, and the base includes at least one first conductive element disposed on the other end of the base.

The support is arranged on the base and is located on the other end of the base with the at least one first conductive element, and the support includes at least one second conductive element.

The at least one LED emitter is electrically connected with the at least one first conductive element and the at least one second conductive element, and each of the at least one LED emitter includes:

a first LED chip string having multiple first LED chips connected in series;

a second LED chip string electrically connected in parallel with the first LED chip string and having multiple second LED chips connected in series;

a substrate configured to support the first LED chip string and the second LED chip string;

a high-color-temperature phosphor layer covering the first LED chip string; and a low-color-temperature phosphor layer covering the second LED chip string.

The driver is electrically connected with the at least one first conductive element and the at least one second conductive element.

A total resistance value of the first LED chip string is different from a total resistance value of the second LED chip string, and the driver outputs different electric currents to the at least one LED emitter via the at least one first conductive element and the at least one second conductive element.

DETAILED DESCRIPTION OF THE PREFERRED EMBODIMENTS

Figure 1:
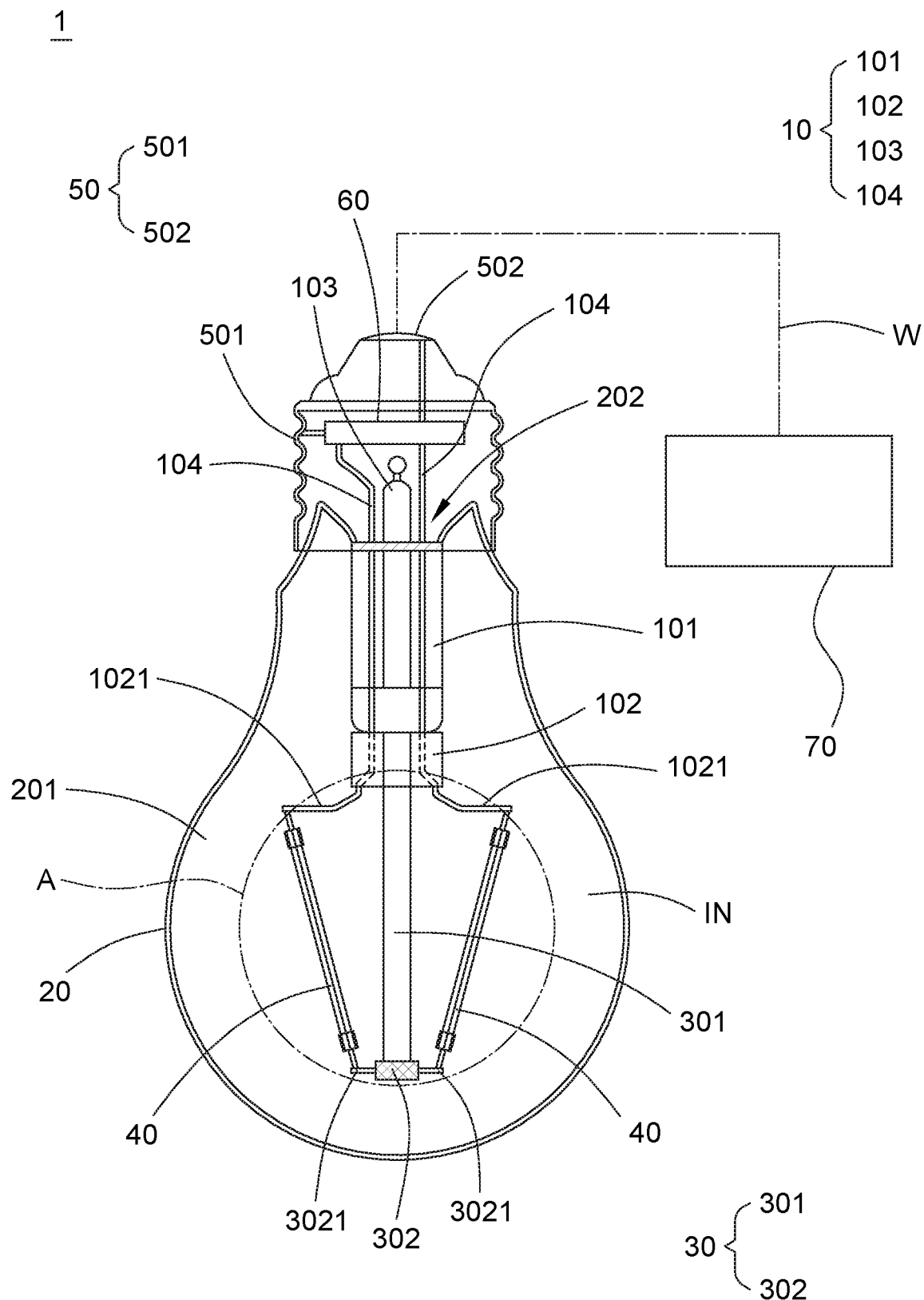
FIG. 1 is a cross sectional view showing the assembly of a light emitting diode (LED) lamp according to a preferred embodiment of the present invention.

With reference to FIG. 1, an LED lamp 1 according to a preferred embodiment of the present invention comprises: a base 10, a casing 20, a support 30, multiple LED emitters 40, a cap 50, and a driver 60.

The casing 20 includes an accommodation chamber 201 and an opening 202 communicating with the accommodation chamber 201. The base 10 is accommodated in the accommodation chamber 201, and an end of the base 10 is connected with the opening 202 so as to close the accommodation chamber 201. The cap 50 is connected with an outer surface of the casing 20 and covers the opening 202, and the driver 60 is received in the cap 50. The cap 50 is electrically connected with a switch 70 via a mains wire W.

The base 10 includes a core post 101, a mounting seat 102, a vent pipe 103, and two conductive wires 104. A first end of the core post 101 closes the opening 202, a second end of the core post 101 is connected with the mounting seat 102 opposite to the first end of the core post 101, wherein the mounting seat 102 has two first conductive elements 1021 disposed on a surface thereof, and the vent pipe 103 is fixed in the core post 101. In assembly, the vent pipe 103 is configured to draw air from the accommodation chamber 201 or to fill inert gas IN with low viscosity and high thermal conductivity into the accommodation chamber 201 so as to enhance heat dissipation of two LED emitters 40. The two conductive wires 104 of the base 10 are electrically connected with the driver 60, and the driver 60 is electrically connected with a metal threaded housing 501 and an electrical contact 502 of the cap 50. The core post 101 of the base 10 is made of glass. The two first conductive elements 1021 are made of a flexible metal sheet with electrically conductivity and supporting function. In this embodiment, the two conductive wires 104 of the base 10 are electrically connected with the cap 50 or an external power supply, such as the mains wire W.

Referring to FIG. 1, the support 30 is arranged on the base 10 and is located on the other end of the base 10 with the two first conductive elements 1021. The support 30 includes a column 301 and a fixer 302. A first end of the column 301 is connected with the mounting seat 102 of the base 10, and the fixer 302 is disposed on a second end of the column 301 away from the base 10. The fixer 302 has two second conductive elements 3021. In this embodiment, the two second conductive elements 3021 are arranged on two opposite surfaces of the fixer 302 respectively, and the two second conductive elements 3021 are made of a flexible metal sheet with electrically conductivity and supporting function.

Two ends of each of the two LED emitters 40 are electrically connected with each of the two first conductive elements 1021 and the two second conductive elements 3021 respectively. The driver 60 is electrically connected with the two first conductive elements 1021 and the two second conductive elements 3021 via the two conductive wires 104 respectively so as to provide power to the two LED emitters 40. The driver 60 is controlled by turning on/off the switch 70 so as to output different electric currents to the two LED emitters 40, thus controlling a color temperature of lights from the two LED emitters 40. The driver 60 is any one of a controllable dimming module, a PWM (Pulse Width Modulation) dimming module, a wall breaking control module, a Wi-Fi control module, and a voice control dimming module.

Figure 2:
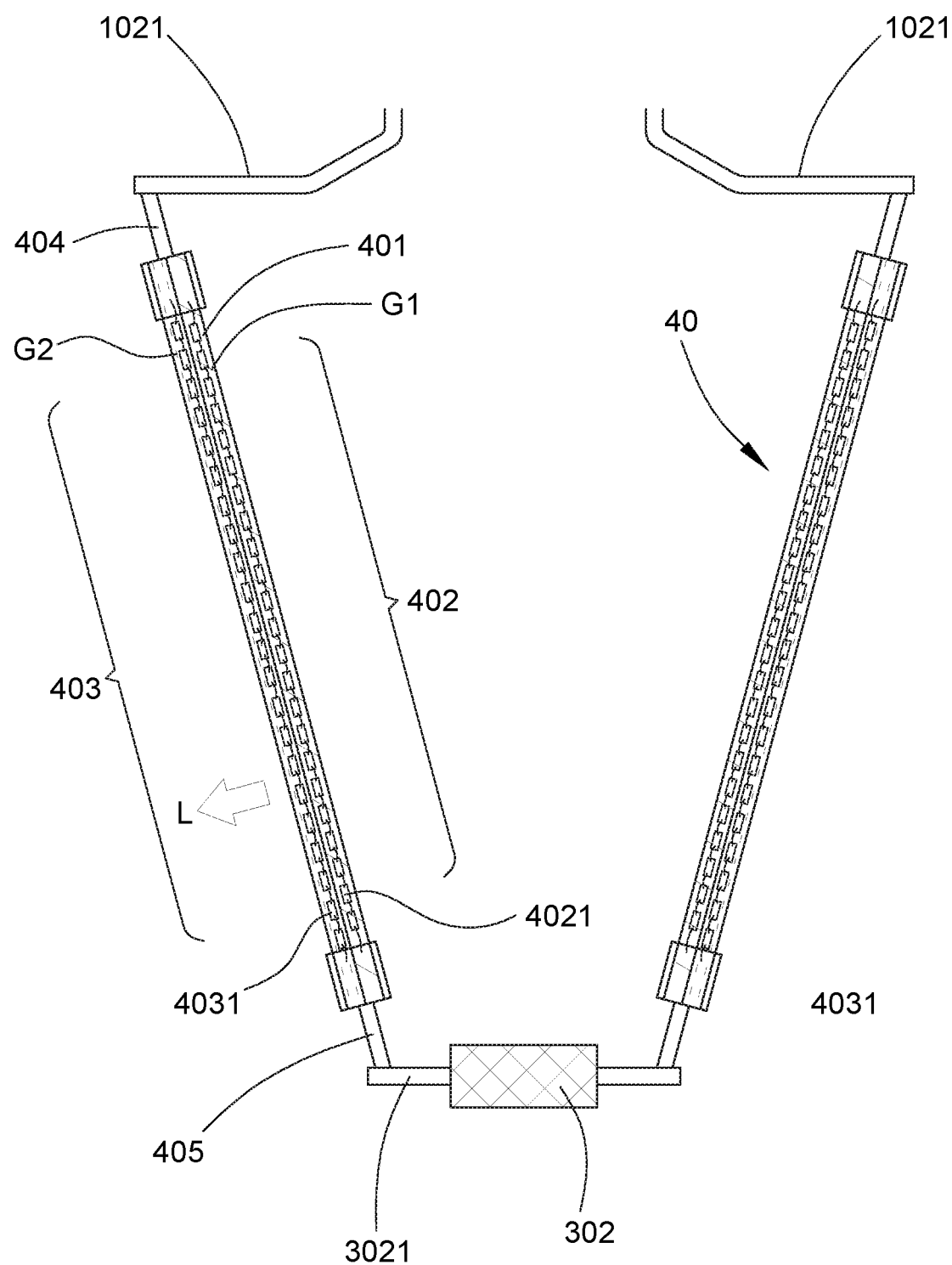
FIG. 2 is an amplified view of a portion A of FIG. 1 according to the preferred embodiment of the present invention.

As shown in FIG. 2, each LED emitter 40 includes a substrate 401, a first LED chip string 402, a second LED chip string 403, a first electrode 404, a second electrode 405, a high-color-temperature phosphor layer G1, and a low-color-temperature phosphor layer G2. The substrate 401 is made of any one of ceramic, sapphire glass, plastic, circuit board, and metal and is configured to support the first LED chip string 402 and the second LED chip string 403, wherein the first LED chip string 402 has multiple first LED chips 4021 connected in series, and the second LED chip string 403 has multiple second LED chips 4031 connected in series. The first LED chip string 402 and the second LED chip string 403 are electrically connected in parallel, and a total resistance value of the first LED chip string 402 is different from a total resistance value of the second LED chip string 403. In another embodiment, the multiple first LED chips 4021 and the second LED chip 4031 have a same model number so as to have a same resistance value. A number of the multiple first LED chips 4021 is different from that of the second LED chips 4031 so that a sum of the resistance values of the multiple first LED chips 4021 is different from that of the second LED chips 4031. In another embodiment, the multiple first LED chips 4021 and the multiple second LED chips 4031 have different model numbers as to have different resistance values respectively. The number of the multiple first LED chips 4021 is more than, equal to or less than the number of the second LED chips 4031, and the sum of the resistance values of the multiple first LED chips 4021 is different from that of the second LED chips 4031.

The high-color-temperature phosphor layer G1 includes yellow-green phosphor and covers the first LED chip string 402, and the low-color-temperature phosphor layer G2 includes red phosphor and yellow-green phosphor and covers the second LED chip string 403. The high-color-temperature phosphor layer G1 and the low-color-temperature phosphor layer G2 also cover a part of the surface of the substrate 401 without being provided with the first LED chip string 402 and the second LED chip string 403. The first electrode 404 and the second electrode 405 disposed on two ends of the LED emitter 40 respectively are electrically connected with the substrate 401.

The first electrode 404 is electrically connected with the two first conductive elements 1021, and the second electrode 405 is electrically connected with the two second conductive elements 3021. When the LED lamp 1 is powered, electric currents flow through the two first conductive elements 1021, the two LED emitters 40, and the two second conductive elements 3021 to form an electric current loop, thus emitting the lights L from the two LED emitters 40. In this embodiment, the LED lamp 1 includes the two LED emitters 40, and a number of the multiple LED emitters 40 based on using requirements.

Figure 3:
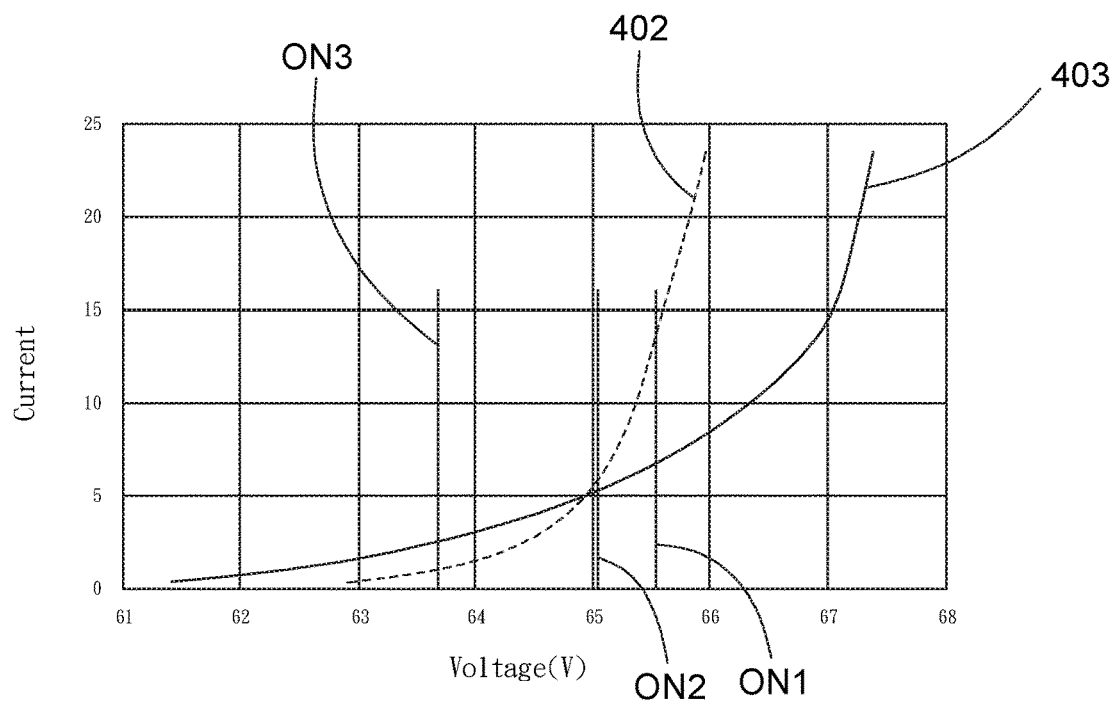
FIG. 3 is a current-voltage characteristic of an LED emitter of the LED lamp according to the preferred embodiment of the present invention.
Figure 4:
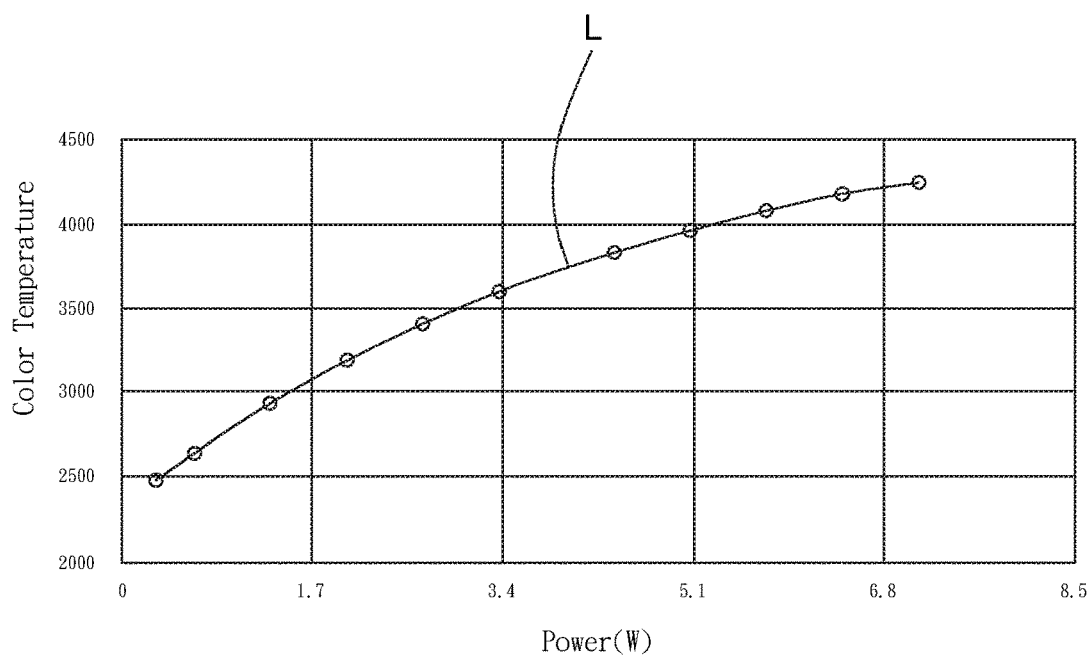
FIG. 4 is a color temperature curve of the LED lamp according to the preferred embodiment of the present invention.

As shown in FIG. 3, an electric current-voltage characteristic of an LED emitter is revealed. The horizontal axis represents the voltage (V) and the vertical axis represents the electric current (mA). Referring to FIG. 4, the color temperature (K) is plotted on the vertical axis and the power (W) on the horizontal axis. As illustrated in FIG. 3, the first LED chip 4021 and the second LED chip 4031 have the same resistance value, the second LED chip string 403 (represented by a solid line) has twenty-four second LED chips 4031, and the first LED chip string 402 (denoted by a dotted line) includes twenty-five first LED chips 4021 so that the total resistance value of the first LED chip string 402 is more than that of the second LED chip string 403.

When the LED lamp 1 is powered on and its power is enhanced, the voltage between the first conductive element 1021 and the second conductive element 3021 is increased, the lights emitted from the first LED chip string 402 and the second LED chip string 403 pass through the high-color-temperature phosphor layer G1 and the low-color-temperature phosphor layer G2 respectively so as to form the lights L with mixed color temperature (as shown in FIG. 2). The second LED chip string 403 has a higher initial brightness because the electric current is always larger (the solid line of the second LED chip string 403 in FIG. 3), when the total resistance value of the second LED chip string 403 is less than a given voltage. Thus, the lights L generated during initial light emission of each LED emitter 40 has a lower color temperature, about 2500 K (as shown in FIG. 4). When the power is increased, the electric current of the first LED chip string 402 is gradually increased (the dotted line of the first LED chip string 402 shown in FIG. 3) so that the brightness of the first LED chip string 402 is also getting higher. The color temperature of the light emitted from each LED emitter 40 is gradually increased from 2500K to 4300K (as shown in FIG. 4) along with the increasing power. Thereby, the color mixing of the lights is more even by electric current modulation of the first LED chip string 402 and the second LED chip string 403. Each LED emitter 40 emits two kinds of lights with different color temperatures so as to solve the problem of different projection angles and achieve better color mixing.

With reference to FIGS. 1 and 3, when desiring to control the color temperature of the lights from the LED lamp 1, the switch 70 is turned on/off successively so as to control the driver 60 to output different electric currents to each LED emitter 40. In this embodiment, when the user turns on/off the switch 70 in the first time (indicated by ON1 of FIG. 3), the driver 60 outputs 22 mA of electric currents to each LED emitter 40 so that a current ratio of the first LED chip string 402 and the second LED chip string 403 is 2:1, an output power of the first LED chip string 402 and the second LED chip string 403 is 8 W, and the color temperature of the lights from the LED lamp 1 is maintained in 4000 K. When the user turns on/off the switch 70 (as denoted by ON2 of FIG. 3), the drivers 60 outputs 11 mA of electric currents to each LED emitter 40 so that a current ratio of the first LED chip string 402 and the second LED chip string 403 is 1:1, an output power of the first LED chip string 402 and the second LED chip string 403 is 8 W, and the color temperature of the lights from the LED lamp 1 is maintained in 3500 K. When the user turns on/off the switch 70 (as represented by ON3 of FIG. 3), the drivers 60 outputs 4 mA of electric currents to each LED emitter 40 so that a current ratio of the first LED chip string 402 and the second LED chip string 403 is 1:3, an output power of the first LED chip string 402 and the second LED chip string 403 is 1.5 W, and the color temperature of the lights from the LED lamp 1 is maintained in 2700 K. Thereby, the driver 60 is shifted in different modes based on the using requirements.

The color temperature of the light emitted from the present LED lamp is adjusted gradually through the LED emitter with high and low color temperatures during power adjustment process. Thus, the LED lamp has a better color mixing.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. An LED lamp comprising:
   a casing including an accommodation chamber and an opening communicating with the accommodation chamber;
   a base accommodated in the accommodation chamber, and an end of the base being connected with the opening so as to close the accommodation chamber, the base including at least one first conductive element disposed on the other end of the base;
   a support arranged on the base and located on the other end of the base with the at least one first conductive element, and the support including at least one second conductive element;
   at least one LED emitter electrically connected with the at least one first conductive element and the at least one second conductive element, and each of the at least one LED emitter including:
   a first LED chip string having multiple first LED chips connected in series;
   a second LED chip string electrically connected in parallel with the first LED chip string and having multiple second LED chips connected in series;
   a substrate configured to support the first LED chip string and the second LED chip string;
   a high-color-temperature phosphor layer covering the first LED chip string; and
   a low-color-temperature phosphor layer covering the second LED chip string;
   a driver electrically connected with the at least one first conductive element and the at least one second conductive element;
   wherein a total resistance value of the first LED chip string is different from a total resistance value of the second LED chip string, and the driver outputs different electric currents to the at least one LED emitter via the at least one first conductive element and the at least one second conductive element.

2. The LED lamp as claimed in claim 1, wherein the multiple first LED chips and the second LED chips have a same resistance value, and a number of the multiple first LED chips is different from that of the multiple second LED chips.

3. The LED lamp as claimed in claim 1, wherein a resistance value of the multiple first LED chips is different from that of the multiple second LED chips, and a number of the multiple first LED chips is different from that of the multiple second LED chips.

4. The LED lamp as claimed in claim 1, wherein a resistance value of the multiple first LED chips is different from that of the multiple second LED chips, and a number of the multiple first LED chips is equal to that of the multiple second LED chips.

5. The LED lamp as claimed in claim 1, wherein the substrate is made of any one of ceramic, sapphire glass, plastic, circuit board, and metal.

6. The LED lamp as claimed in claim 1, wherein the base includes a core post and a mounting seat, a first end of the core post closes the opening, and a second end of the core post is connected with the mounting seat opposite to the first end of the core post.

7. The LED lamp as claimed in claim 6, wherein the at least one first conductive element and the support are disposed on the mounting seat.

8. The LED lamp as claimed in claim 6, wherein the base further includes a vent pipe fixed in the core post.

9. The LED lamp as claimed in claim 1 further comprising a cap connected with the casing and covering the opening, wherein the driver is received in the cap.

10. The LED lamp as claimed in claim 9, wherein the cap includes a metal threaded housing and an electrical contact of the cap connected with the metal threaded housing.

11. The LED lamp as claimed in claim 10, wherein the base further includes at least two conductive wires electrically connected with the driver, and the driver is electrically connected with the metal threaded housing and the electrical contact of the cap.

12. The LED lamp as claimed in claim 9, wherein the cap is electrically connected with a switch via a mains wire.

13. The LED lamp as claimed in claim 1, wherein the driver is any one of a controllable dimming module, a PWM (Pulse Width Modulation) dimming module, a wall breaking control module, a Wi-Fi control module, and a voice control dimming module.

14. The LED lamp as claimed in claim 1, wherein the support includes a column and a fixer, a first end of the column is connected with the base, and the fixer is disposed on a second end of the column away from the base.

15. The LED lamp as claimed in claim 14, wherein the at least one second conductive element is arranged on the fixer.

16. An LED emitter comprising:
   a first LED chip string having multiple first LED chips connected in series;
   a second LED chip string electrically connected in parallel with the first LED chip string and having multiple second LED chips connected in series;
   a substrate configured to support the first LED chip string and the second LED chip string;
   two electrodes electrically connected with the substrate;
   a high-color-temperature phosphor layer covering the first LED chip string; and
   a low-color-temperature phosphor layer covering the second LED chip string;
   wherein a total resistance value of the first LED chip string is different from a total resistance value of the second LED chip string.

17. The LED lamp as claimed in claim 16, wherein the multiple first LED chips and the second LED chips have a same resistance value, and a number of the multiple first LED chips is different from that of the multiple second LED chips.

18. The LED lamp as claimed in claim 16, wherein a resistance value of the multiple first LED chips is different from that of the multiple second LED chips, and a number of the multiple first LED chips is different from that of the multiple second LED chips.

19. The LED lamp as claimed in claim 16, wherein a resistance value of the multiple first LED chips is different from that of the multiple second LED chips, and a number of the multiple first LED chips is equal to that of the multiple second LED chips.

20. The LED lamp as claimed in claim 16, wherein the substrate is made of any one of ceramic, sapphire glass, plastic, circuit board, and metal.

* * * * *